United States Patent [19]

Yakmovitz

[11] Patent Number: 4,459,551
[45] Date of Patent: Jul. 10, 1984

[54] TELEVISION RECEIVER AND TEST SET VOLTAGE ANALYZER

[75] Inventor: Kenneth J. Yakmovitz, Jermyn, Pa.

[73] Assignee: RCA Corporation, New York, N.Y.

[21] Appl. No.: 306,354

[22] Filed: Sep. 28, 1981

[51] Int. Cl.³ .......................................... G01R 31/024
[52] U.S. Cl. ..................................... 324/404; 324/54; 324/158 F; 324/407
[58] Field of Search ............... 324/404, 405, 407, 408, 324/409, 51, 54, 158 F, 66, 73 R; 455/226

[56] References Cited

U.S. PATENT DOCUMENTS 1,954,305  4/1934  Williams ............................... 324/404
2,823,304  2/1958  Shiels ............................ 324/158 F
2,852,737  9/1958  Wheeler ................................ 324/54

Primary Examiner—Michael J. Tokar
Assistant Examiner—Kevin D. O'Shea
Attorney, Agent, or Firm—Eugene M. Whitacre; Dennis H. Irlbeck; Lester L. Hallacher

[57] ABSTRACT

A television receiver and test set voltage analyzer includes a set of parallel connected switches which individually apply the various operating voltages to a readout device. The analyzer replaces a television picture tube so that the verification of the presence of all operating voltages indicates a failed tube while the absence of an operating voltage indicates a receiver or test set failure.

6 Claims, 2 Drawing Figures

TELEVISION RECEIVER AND TEST SET VOLTAGE ANALYZER

BACKGROUND OF THE INVENTION

This invention relates generally to the testing of the operating voltages applied to a television picture tube and particularly to a television receiver and test set voltage analyzer.

There are many instances requiring the analysis and verification of the operating voltages which are applied to a television picture tube. One such instance occurs as the final stage of producing such tubes. Typically after the manufacturing of a color television tube is completed the tube is tested to verify that the electron guns, focusing lens and other operational components within the tube are operational within the required specifications. Typically, the testing is accomplished by inserting the tube into a test set which simulates a television receiver. The test set then applies the focusing, filament and operational voltages to the tube so that the intended operation of the tube in a television receiver is simulated. The failure of the tube to operate properly ordinarily is interpreted as a failure of the tube and the tube is rejected. However, it is quite possible that the test set malfunctioned and failed to place all the required operating voltage onto the tube and an acceptable tube is erroneously rejected. This difficulty can be overcome by the utilization of a voltage analyzing device which verifies the presence of the required operating voltages within the test set.

Another instance in which a device for verifying the presence of the required operating voltages in a television receiver is useful occurs during the diagnosis of a malfunctioning receiver. Frequently when a repairman enters a home to repair an inoperative television receiver, it is impossible for him to determine on site whether the failure has occured with the receiver or the picture. In such instances the repairman must transport the receiver from the site and to a repair facility where sophisticated test equipment is available. Accordingly, the availability of a voltage analyzing device which simulates the television tube could be used to verify the presence of the operating voltages within the receiver. If all the required operating voltages are available the repairman will immediately know that the difficulty lies in the picture tube. Alternatively, it one of the voltages is not available the repairman will immediately know the circuit in which the difficulty lies and in many instances will be able to repair the receiver on the premises and avoid the expense and inconvenience of transporting it to a repair facility.

The instant invention alludes to these disadvantages by the provision of a television receiver and test set voltage analyzer which is used to replace the television picture tube to verify the presence of the proper operating voltages in a television receiver or a test set used for the testing of manufactured picture tubes.

SUMMARY OF THE INVENTION

A device for checking the operating voltages applied to a television picture tube includes a connector which mates with the connector utilized to apply the operating voltages to the picture tube. A first set of switches selectively applies a biasing voltage source to the device in accordance with bipotential, tripotential, and high potential operation of the picture tube. A second set of switches is coupled to the first set of switches for individually verifying the presence of the operating voltages. A third set of switches is individually responsive to the switches of the second set of switches. The switches of the third set are coupled to the connector whereby actuation of any switch of the second set of switches actuates at least one switch of the third set to provide one of the operating voltages as an output signal. A readout device is responsive to the output signal so that a reading verifies the presence of one of the operating voltages.

DETAILED DESCRIPTION OF THE PREFERRED EMBODIMENT

Figure 1A:
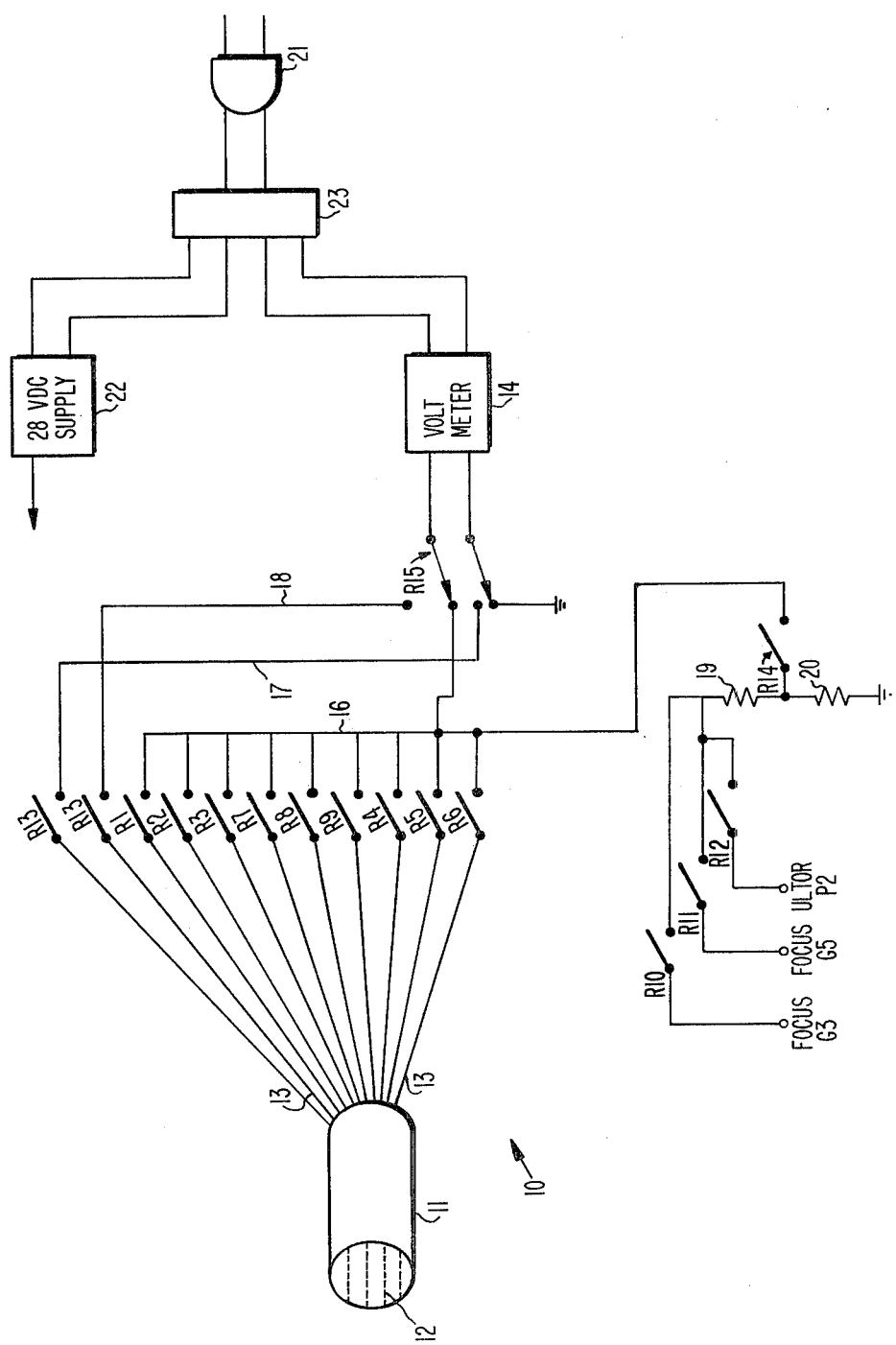
FIGS. 1a and 1b are schematic circuit diagrams of a preferred embodiment of the instant invention.

In FIG. 1a, the inventive television receiver and test set voltage analyzer 10 includes a connector 11 which is configured to duplicate the base connector available on the end of a television picture tube. The connector 11 includes a plurality of pins 12 which are inserted into a socket contained within the television receiver so that the operating voltages which normally are applied to the television tube are applied to the analyzer 10. The pins 12 are electrically connected to a plurality of switches R1 to R9 and R13 by a plurality of wires 13. The switches R1 to R9 and R13 are connectable to a readout means 14, such as a digital voltmeter, through a switch R15 by way of conductors 16, 17, and 18. The G3 focus voltage, the G5 focus voltage and the ultor, or P2, voltage are connected to the voltmeter 14 through switches R10, R11, and R12, respectively, through a voltage divider consisting of resistors 19 and 20 and another switch R14.

A connector 21 is electrically connected to the voltmeter 14 and a 28-volt DC supply 22 through a terminal board 23. The connector 21, therefore, is used to energize the voltmeter 14 and the power supply 22 with standard 110 volt 60 Hz power.

When using the inventive voltage analyzer 10 to verify the presence of the operating voltages of either a television receiver or a tube test set, the female connector of the receiver or test set is disconnected from the television tube and connected to the male connector 11. Since different tube types have different shaped bases, it may be necessary to use an appropriate adaptor to make this correction. The G3 and G5 focus voltages and ultor voltage are connected to the switches R10, R11, and R12, respectively. The switches R1 through R13 are individually and sequentially closed in a manner described hereinafter with respect to FIG. 1b to sequentially verify the presence and level of the various operating voltages within the television receiver or test set by noting the reading on the voltmeter 14. In those instances in which the presence and proper level of all the operational voltages are indicated by the voltmeter 14, the receiver or test set is known to be operational. In those instances in which the presence of the operating voltages is not verified or the level is improper, the television receiver or test set is immediately known to be defective. In many instances when the tube is in a receiver, the repair can be made on the site rather than taking the receiver to a repair facility.

Figure 1B:
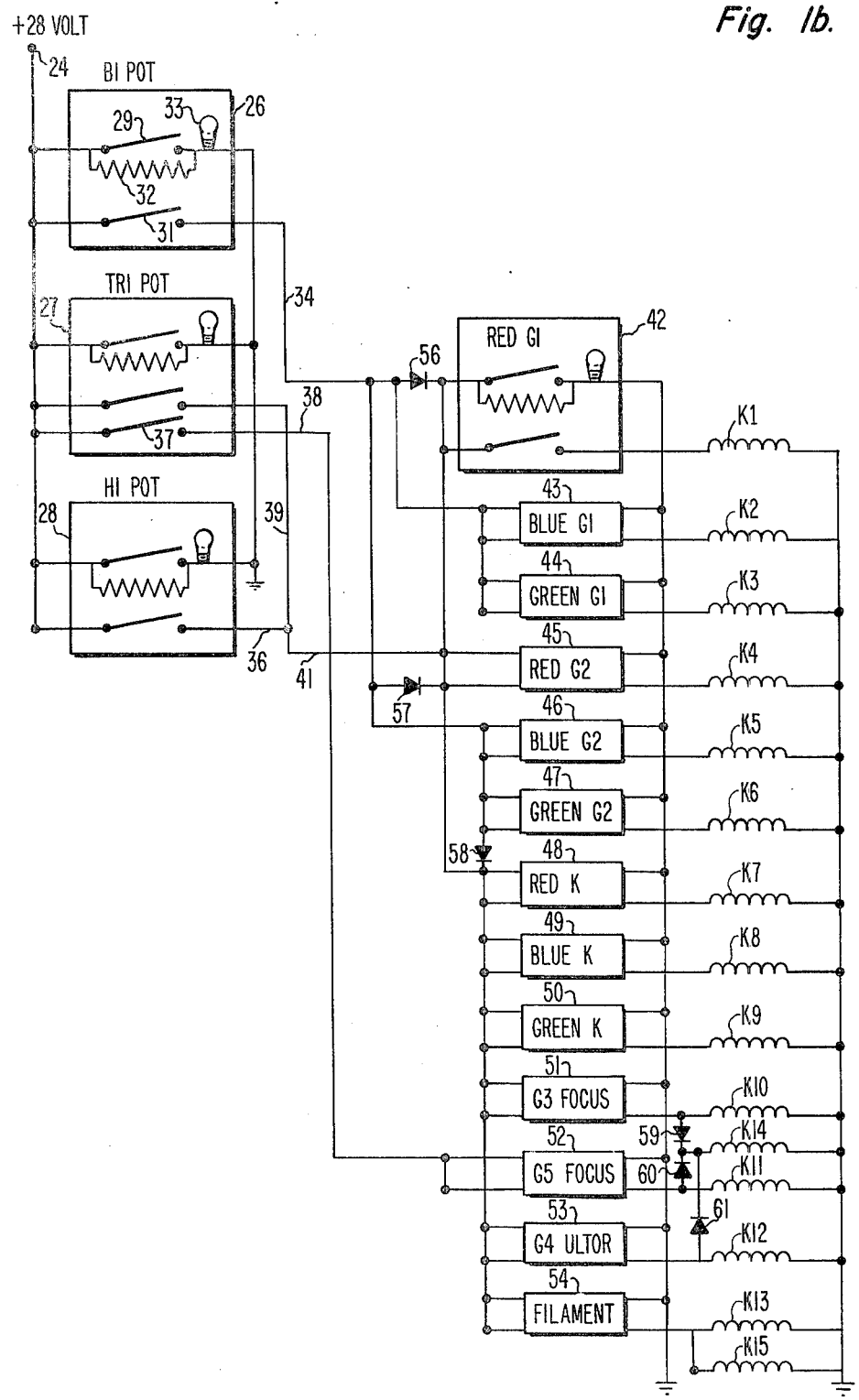

The output voltage of the voltage supply 22 is applied to the input terminal 24 of the switching arrangement shown in FIG. 1b. The 28-volt supply voltage is input to three manually operable switches 26, 27, and 28 which are individually used to simulate the various types of operation of television picture tubes. Some picture tubes utilize two voltages in the focus lens and thus are called bipotential, or bipot, tubes. Other picture tubes use three voltages on the focus lens and thus are called tripotential, or tripot, tubes. The switch 26 is used when the tube being tested is a bipotential tube. The switch 27 is used when the tube being tested is tripotential. The switch 28 is used for all types of tubes to verify the presence of the high potentials of the receiver or test set. The switch 26 includes two simultaneously actuated switch blades 29 and 31. A shunting resistor 32 connects a lightbulb to the 28-volt bias and is dimly lit when the 28-volt supply voltage is turned on to verify that the bias voltage is being applied to the switch. When the blade 29 is closed, the resistor 32 is shorted out and the bulb 33 grows brighter to verify the operation of the switch. The closing of the blade 31 applies the 28-volt bias to the output line 34. The high potential switch 28 is identical to the switch 26 and the actuation of this switch places the 28-volt bias on the output line 36. The tripotential switch 27 is identical to the switches 26 and 28 but includes an additional switch blade 37 so that the closing switch places the 28-volt bias on the two output lines 38 and 39. The lines 36 and 39 are electrically connected to a line 41 so that closing either the switch 27 or 28 places the 28-volt bias onto the line 41.

A plurality of identical manually operable switches 42–54 are arranged in parallel to receive the 28-volt bias supplied from the lines 34, 38, and 41. The switches 42–54 are identical to the switch 26 and include a lamp for verifying the operation of the switches. The connections of the parallel connected switches 42–54 to the lines 34, 38, 39 and 41 are made through unidirectional control means in the form of diodes 56, 57, and 58 which are arranged so that only the switches which are used to verify either bipot, tripot or hipot operation are illuminated when one of the switches 26, 27, or 28 is actuated. The switches 42–54, respectively, energize a plurality of coils K1 through K15 so that the closing of one of the switches causes current to pass through one of the coils. The passage of current through a coil causes the closing of one of the switches R1 through R15 of FIG. 1a thereby applying one of the operational voltages from the receiver or test set to the voltmeter 14 through the connector 11. The coils and switches are similarly numbered whereby current through coil K1, for example, closes switch R1. Thus, when the switch 42 is closed, current passes through the coil K1, resulting in the closing of the switch R1 and a reading indication on the voltmeter 14 verifies the presence of the red G1 focus voltage.

A coil K14 is arranged between ground and the junction of unidirection control means in the form of two oppositely poled diodes 59 and 60. Additionally, a diode 61 is connected across the high sides of the coils K12 and K14. The diodes 59, 60 and 61 cause current to flow through the coil K14 when either of the switches 51, 52 or 53 is closed. Current flows through the coil K14, closes the switch R14 of FIG. 1a and either of the voltages associated with the switches R10, R11 or R12 can be connected to the voltmeter 14 through the switch R14 and the voltage divider composed of the resistors 19 and 20.

The switch 54 is coupled to two parallel connected coils K13 and K15. Closing the switch 54, therefore, energizes the switch R15 and both of the switches R13 of FIG. 1a. The switches R13 apply both of the receiver filament voltages to the voltmeter 14.

What is claimed is:

1. A device for checking for the presence of operating voltages applied to a television picture tube having a first connector comprising:
   a second connector configured to duplicate said first connector of said picture tube and to mate with a third connector utilized to apply the operating voltage to said picture tube;
   a first plurality of separately and manually operable switches for selectively applying a voltage source to said device in accordance with bipotential, tripotential, and high potential operation of said picture tube;
   a second plurality of separately and manually operable switches coupled to said first plurality of switches for individually verifying said presence of said operating voltages;
   a third plurality of switches individually responsive to the switches of said second plurality of switches, said third plurality of switches being coupled to said second connector whereby actuation of one switch of said second plurality of switches actuates at least one switch of said third plurality of switches to provide one of said television picture tube operating voltages as an output signal; and
   readout means responsive to said output signal so that a reading of said readout means verifies the presence of one of said television picture tube operating voltages.

2. The device of claim 1 wherein said second plurality of switches includes a separate switch for each of said operating voltages.

3. The device of claim 2 wherein the switches of said second plurality of switches are arranged in parallel.

4. The device of claim 3 wherein the switches of said third plurality of switches are voltage sensitive so that the actuation of at least one of said second plurality of switches actuates at least one of said third plurality of switches.

5. The device of claim 4 further including undirectional control means arranged to provide voltage isolation between at least some of said plurality of switches.

6. The device of claim 2 or 3 wherein said first plurality of switches includes a separate individually operable switch for selecting simulation of bipotential, tripotential, and high potential operation of said picture tube.

* * * * *